(12) United States Patent
Tatsumi et al.

(10) Patent No.: US 7,045,389 B1
(45) Date of Patent: May 16, 2006

(54) METHOD FOR FABRICATING A SEMICONDUCTOR DEVICES PROVIDED WITH LOW MELTING POINT METAL BUMPS

(75) Inventors: Kohei Tatsumi, Kawasaki (JP); Kenji Shimokawa, Kawasaki (JP); Eiji Hashino, Kawasaki (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/632,910

(22) Filed: Aug. 4, 2000

Related U.S. Application Data

(62) Division of application No. 09/254,119, filed as application No. PCT/JP97/02987 on Aug. 27, 1997.

(30) Foreign Application Priority Data

Aug. 27, 1996 (JP) .................................. 8-244269

(51) Int. Cl.
*H01L 21/48* (2006.01)
*H01L 23/48* (2006.01)
*B23K 31/00* (2006.01)
*H01R 43/00* (2006.01)

(52) U.S. Cl. .................. 438/108; 438/613; 228/180.22; 29/884; 257/780

(58) Field of Classification Search ................ 438/108, 438/612, 613, 614, 106, 118; 228/180.21, 228/180.22; 29/874, 876–879, 884; 257/738, 257/779–781, 786
See application file for complete search history.

(56) References Cited

U.S. PATENT DOCUMENTS

| 4,940,181 A | 7/1990 | Juskey, Jr. et al. ...... 228/180.22 |
| 5,219,117 A | 6/1993 | Lin ............................. 228/253 |
| 5,773,359 A * | 6/1998 | Mitchell et al. ............ 438/614 |
| 5,833,128 A | 11/1998 | Kloeser et al. ........ 228/180.22 |

FOREIGN PATENT DOCUMENTS

EP          0 527 387        2/1993

(Continued)

OTHER PUBLICATIONS

International Search Report PCT/JP97/02987.

(Continued)

*Primary Examiner*—Alonzo Chambliss
(74) *Attorney, Agent, or Firm*—Kenyon & Kenyon

(57) ABSTRACT

A semiconductor device (1) comprising electrodes formed on a semiconductor chip (2) and bumps (3) which consist of a low melting point metal ball spherically formed and having a given size and which are adhesive bonded to the electrodes (5). The electrodes (5) are formed from an electrode material of Cu or a Cu alloy, Al or an Al alloy, or Au or a Au alloy. When the electrode material is composed of Al or an Al alloy, the electrodes contain, on the electrode material layer of Al or an Al alloy, at least one layer (6) composed of a metal or metal alloy (preferably a metal selected form Ti, W, Ni, Cr, Au, Pd, Cu, Pt, Ag, Sn or Pb, or an alloy of these metals) having a melting point higher than the electrode material. The low melting point metal balls (3) are adhesive bonded to the electrodes (5) preferably with a flux. The low melting point metal balls (3) adhesive bonded to the respective electrodes (3) may also be reflowed to form semispherical bumps (10) before use.

5 Claims, 4 Drawing Sheets

FOREIGN PATENT DOCUMENTS

| | | |
|---|---|---|
| JP | 59 148352 | 8/1984 |
| JP | 2-180036 | 7/1990 |
| JP | 02 299288 | 12/1990 |
| JP | 02 278831 | 2/1991 |
| JP | 04 065130 | 3/1992 |
| JP | 06 333930 | 12/1994 |
| JP | 07 193068 | 7/1995 |
| JP | 08 118005 | 5/1996 |
| JP | 8-139093 | 5/1996 |
| JP | 8-139097 | 5/1996 |
| JP | 8-162494 | 6/1996 |
| JP | 09 082719 | 3/1997 |

OTHER PUBLICATIONS

"Micro-ball Bump Technology for Fine-pitch Interconnections", Shimokawa K; Tatsumi K; Hashino E; Ohzeki Y; Konda M; Kawakami Y; Conference Proceedings Article 1st 1997 IEMT/IMC Symposium (IEEE Cat. No. 97CH36059), Proceedings of 1997 First International Electronic Manufacturing Technology (IEMT) IMC Symposium, Tokyo, Japan, Apr. 16-18, 1997; ISBN 0-7803-4235-6, pp. 105-109.

* cited by examiner

METHOD FOR FABRICATING A SEMICONDUCTOR DEVICES PROVIDED WITH LOW MELTING POINT METAL BUMPS

This application is a divisional application under 37 C.F.R. §1.53(b) of prior application Ser. No. 09/254,119 filed Apr. 16, 1999 which is a 35 U.S.C. 371 of PCT/JP97/02987 filed Aug. 27, 1997. The disclosures of the specification, claims, drawings and abstract of application Ser. No. 09/254,119 and PCT/JP97/02987 are incorporated herein by reference.

TECHNICAL FIELD

The present invention relates to a semiconductor device provided with low melting point metal bumps and a process for producing the same.

BACKGROUND ART

Semiconductor devices have currently been used widely in various fields. The semiconductor devices are usually used by mounting them on substrates. The mounting methods include bonding methods such as tape automated bonding (TAB), wire bonding and flip chip bonding.

The TAB and wire bonding are technologies by which a semiconductor device is mounted on a substrate through leads. The leads are arranged in one row per peripheral side of the semiconductor device. The technologies are, therefore, not suited to high density mounting of the semiconductor devices. In contrast to the technologies mentioned above, flip chip bonding is a technology by which the electrodes of a semiconductor device are directly-connected to the electrode terminals on the substrate through a bonding metal. Since the electrodes of the semiconductor device can be provided in a lattice-like form on the entire surface, the technology is suited to high density mounting. Various solders are generally used as bonding metal in flip chip bonding because the bonding is conducted by melting at low temperature.

In flip chip bonding, semiconductor devices provided with low melting point metal bumps for bonding placed on electrodes are used, and the semiconductor devices are connected to the electrode terminals of substrates by a reflowing procedure by which the bumps are melted and solidified again.

In general, the bumps are formed by vapor deposition or plating. However, such bump formation methods must all repeat complicated treatments steps using a mask. Moreover, in the method of forming the bumps by vapor deposition, a bump material is deposited on portions where the bumps are not to be formed, and the deposition amount thereon is very large. The method is, therefore, not a preferred one in view of the cost and efficiency. Moreover, wet plating such as electroplating or electroless plating fouls wafers and causes an environmental problem, and countermeasures against such problems are indispensable. As illustrated above, conventional methods for forming the bumps are relatively costly, and practical use of the methods is restricted.

There is a stud bump procedure as a method for forming bumps other than vapor deposition and plating. Since bumps are formed one by one in the procedure, the production efficiency is low, and in addition the bump amount tends to vary among the bumps. Accordingly, securing uniformity in bonding the semiconductor devices and the substrates is difficult.

DISCLOSURE OF THE INVENTION

An object of the present invention is to provide a semiconductor device provided with low melting point metal bumps of high quality and capable of being mounted on a substrate by flip chip bonding, and a process for producing the same.

The semiconductor device of the present invention comprises electrodes formed on a semiconductor chip, and is provided with bumps each consisting of a low melting point metal ball which is spherically formed and has a given size, and adhesive bonded to the electrodes.

The low melting point metal balls are preferably adhesive bonded to the respective electrodes with a flux.

The electrodes on the semiconductor chip are preferably formed from an electrode material of Cu or a Cu alloy, Al or an Al alloy, or Au or a Au alloy.

When the electrode material is Al or an Al alloy, at least one layer of a metal or a metal alloy having a melting point higher than the electrode material is preferably laminated to the layer formed from the electrode material.

The laminated layers are preferably formed from a metal selected from Ti, W, Ni, Cr, Au, Pd, Cu, Pt, Ag, Sn and Pb, or an alloy of these metals.

It is preferred that, of the layers laminated to the electrode material layer, the layer contacted with the electrode material layer be formed from Ti, W, Ni, Cr, Pd, Cu or Pt, or an alloy of these metals, and that the layer contacted with the low melting point metal ball be formed from Ni, Au, Pd, Cu, Pt, Ag, Sn or Pb, or an alloy of these metals.

The process for producing a semiconductor device according to the present invention is a process for producing a semiconductor device having electrodes formed on a semiconductor chip, and provided with bumps which consist of low melting point metal balls each being formed spherically and having a given size, and which are adhesive bonded to the respective electrodes, and is characterized by the low melting point metal balls being adhesive bonded and fixed to the respective electrodes with a flux.

The flux is preferably applied to the electrodes.

On another aspect of the present invention, the process for producing a semiconductor device according to the present invention is a process for producing a semiconductor device provided with low melting point metal bumps on the electrodes on a semiconductor chip, the process comprising the steps of:

adhesive bonding low melting point metal balls each being spherically formed and having a given size to the respective electrodes, and reflowing the low melting point metal balls.

The low melting point metal balls are preferably adhesive bonded to the respective electrodes with a flux.

The flux is preferably applied to the electrodes.

BEST MODE FOR CARRYING OUT THE INVENTION

Figure 1:
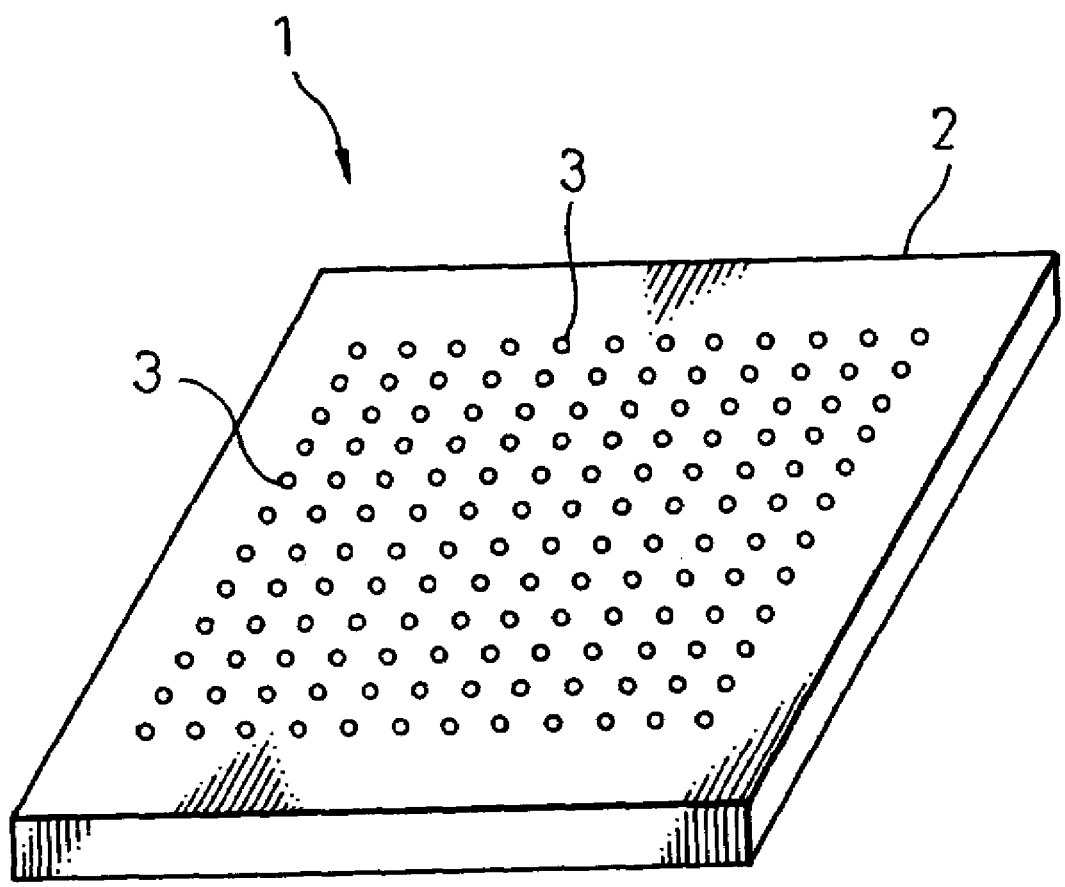
FIG. 1 is a perspective view illustrating a semiconductor device of the present invention.

FIG. 1 shows a semiconductor device 1 of the present invention. The semiconductor device 1 is provided with low melting point metal ball bumps 3 adhesive bonded onto the electrodes (not shown) formed on a surface of a semiconductor chip 2.

The low melting metal balls 3 can be formed from one of the various solders used for mounting a semiconductor device on a substrate. Examples of the solders include solders of Sn alloys such as a Sn—Pb alloy and a Sn—Ag alloy and solders of Pb alloys such as a Pb—In alloy.

The electrodes to which the bumps 3 of low melting point metal balls are adhesive bonded can be formed from an electrode material of Cu or a Cu alloy, Al or an Al alloy, or Au or a Au alloy. In the semiconductor device of the present invention, an electrode having a surface area of 900 to 22,500 $\mu m^2$ is preferably used. That is, when a square electrode is used, one of the sides of the electrode has a dimension of 30 to 150 μm.

When the electrode material is Al or an Al alloy, connecting solder balls (the term solder balls designates low melting metal balls hereinafter and is used below) to an electrode by reflowing deteriorates the bonding between the solder balls and the electrode. When Al or an Al alloy is used as an electrode material, at least one layer of a metal or an alloy of the metal having a melting point higher than the electrode material is laminated to the layer formed of the electrode material to avoid the deterioration. A typical example of the material used as the material therefor is a metal selected from Ti, W, Ni, Cr, Au, Pd, Cu, Pt, Ag, Sn and Pb, or an alloy of these metals. Of these substances, Ti, W, Ni, Cr, Pd, Cu or Pt, or an alloy of these metals is particularly effective in bonding between the material and the layer formed from Al or its alloy. Accordingly, any of the above metals or an alloy of these metals is preferably used as a layer contacted with the layer of Al or its alloy. Moreover, a solder generally shows good wettability with Ni, Au, Pd, Cu, Pt, Ag, Sn or Pb, or an alloy of these metals. Of layers laminated to the electrode material layer of Al or an Al alloy, the layer contacted with the solder ball is, therefore, preferably formed from these materials.

Figure 2:
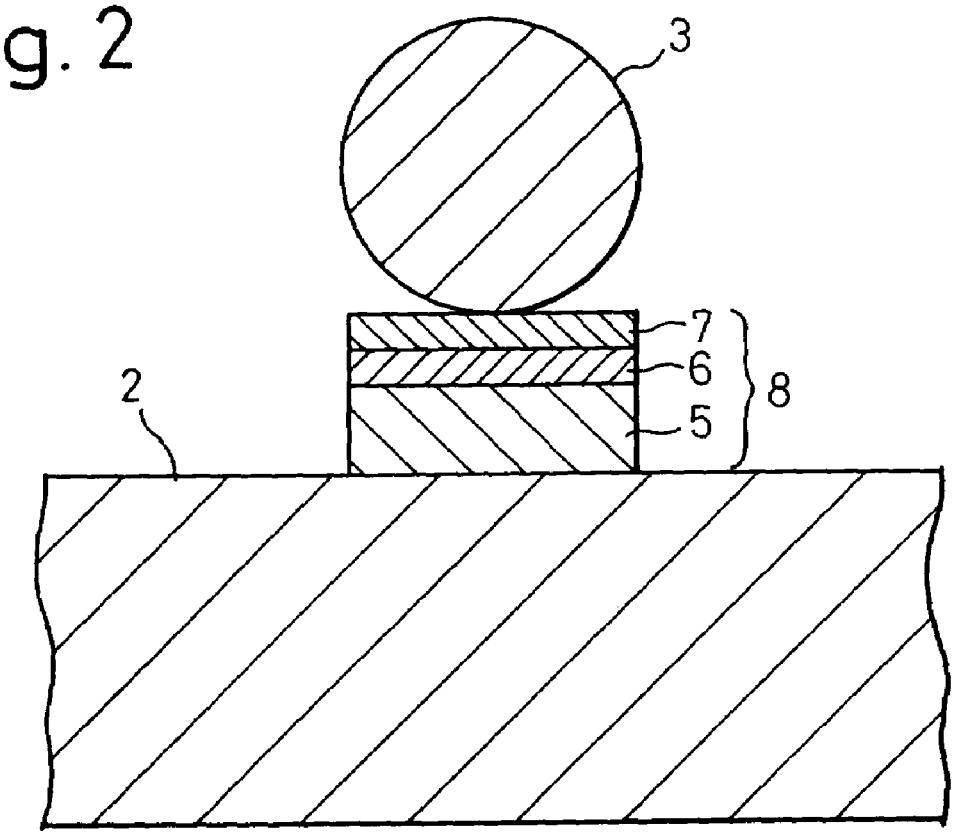
FIG. 2 is a view illustrating an electrode in the semiconductor device of the present invention.

As explained above, when Al or an Al alloy is used, the electrode has a multilayered structure as illustrated in FIG. 2. In FIG. 2, an electrode 8 is formed as a laminated structure including a first layer 5 made of Al (or an Al alloy) on a surface of a semiconductor chip 2, a second layer 6 made of Cr on the first layer, and a third layer 7 made of Cu on the second layer.

In addition to the laminated structure successively having from the semiconductor chip side an Al (or Al alloy) layer, a Cr layer and a Cu layer (such a laminated structure being represented as Al/Cr/Cu hereinafter) as illustrated in FIG. 2, examples of the laminated structure of the electrode in which Al or its alloy is used as an electrode material may include Al/Ni, Al/Ni/Au, Al/Ni/Cu/Au, Al/Cr/Cu/Au, Al/Ti/Cu/Au, Al/Ti/TiW (alloy)/Cu/Au, Al/TiW (alloy)/Cu/Au, Al/Cr/Ni/Pd, Al/Pd/Au, Al/Ni/Sn, Al/Cr/Cu/Pd and Al/Cr/Pt.

It is needless to say that effective electrode laminated structures are not limited to the structures mentioned above in the semiconductor device of the present invention.

A flux is preferably used for adhesive bonding the solder ball to the electrode. Any of the fluxes generally used in producing semiconductor devices may be used. Although the flux may be applied to either the solder ball or the electrode surface, it is preferably applied to the electrode surface. Standard methods such as screen printing may be utilized for the method for applying the flux to the electrode surface.

When the semiconductor device of the present invention is flip chip bonded to a substrate, the solder ball bumps may be made to face the respective electrode terminals of the substrate, positioned, and contacted therewith, followed by reflowing the bumps. Such a procedure of flip chip bonding has been widely known, and it is needless to explain in detail.

Figure 3:
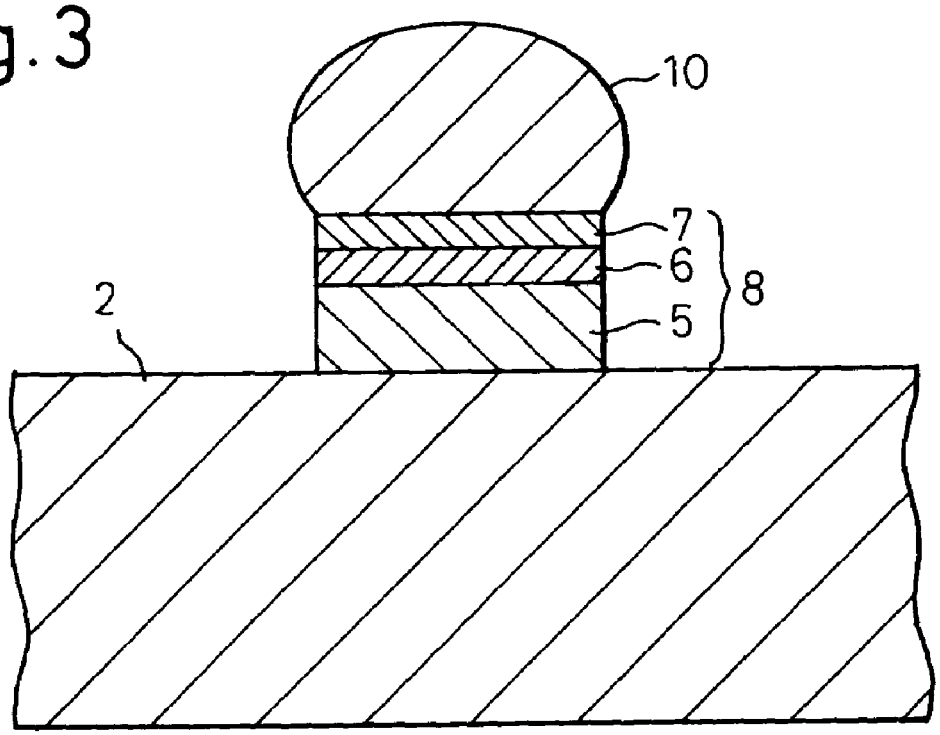
FIG. 3 is a view illustrating a semispherical bump of the semiconductor device of the present invention which bump is formed by reflowing a low melting point metal ball.

The semiconductor device of the present invention may be flip chip bonded to the substrate after the solder balls are reflowed once to form semispherical bumps. FIG. 3 shows an example of a semispherical bump. The semispherical bump 10 in FIG. 3 is formed by reflowing the solder ball bump 3 adhesive bonded to the laminated electrode 8 having been explained in FIG. 2.

In addition, the bump 10 in FIG. 3 formed by reflowing a solder ball is herein described as semispherical. The term is mainly based on the longitudinal sectional shape of the bump subsequent to reflowing as shown in FIG. 3. Electrodes on semiconductor chips have various shapes such as a circular shape, a square shape and other arbitrary shapes. For example, a bump formed by reflowing a solder ball on a square electrode has a semispherical longitudinal sectional shape as seen in FIG. 3. However, since the molten solder wets the entire square electrode surface and then solidifies, the shape viewed from above (transverse sectional shape) is not a circle but a square or a shape close to a square. Accordingly, it should be noted that the semispherical bump herein termed includes not only a bump appearing to have a circular cross sectional shape when viewed from above after reflowing but also a bump having an arbitrary transverse cross sectional shape reflecting the electrode shape under the bump. That is, "a semispherical bump" herein designates all sorts of bumps formed by reflowing solder balls adhesive bonded to electrodes having an arbitrary shape.

In order to appropriately form a semispherical bump on an electrode by reflowing a solder ball, the radius R of the solder ball to be adhesive bonded to the electrode is desirably selected so that the equation $$0.4\sqrt{A} \leq R \leq 2\sqrt{A}$$

wherein A is the surface area of the electrode, is satisfied. When the radius R of the solder ball is less than $0.4\sqrt{A}$, the amount of the solder becomes insufficient, and formation of a good semispherical bump subsequent to reflowing becomes difficult. When the radius R of the solder ball exceeds $2\sqrt{A}$, the semispherical bump becomes large compared with the size of the electrode. Consequently, the bonded portion between the electrode and the bump is subjected to stress concentration, and tends to be fractured.

When an electrode having a surface area of 900 to 22,500 $m^2$ is used in the semiconductor device of the present invention, a preferred radius R of the solder ball derived from the above equation is from 12 to 300 μm.

An example of the production of a semiconductor device in the present invention will be explained by making reference to FIG. 4.

Figure 4A:
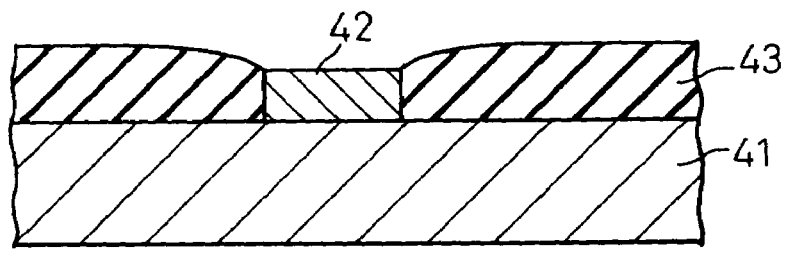
FIGS. 4A to 4D are views illustrating a process for producing the semiconductor device of the present invention.
Figure 4B:
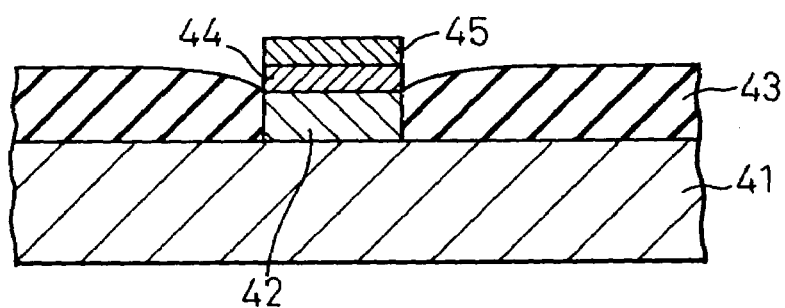

As shown in FIG. 4A, a 100×100 μm electrode 42 1.0 μm thick of an Al alloy (Al—Si—Cu alloy) is formed on a semiconductor chip 41 by sputtering. The reference numeral 43 in the figure designates a passivation film which compartments the electrode thus formed. Next, a metal layer 44 of Ni and a metal layer 45 of Cu each having a thickness of 80 nm are successively laminated to the chip electrode 42 by sputtering, as shown in FIG. 4B.

Figure 4C:
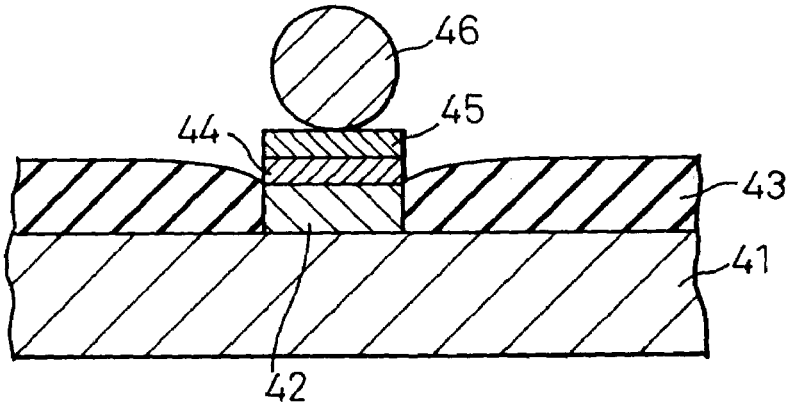

What is explained above is about the step for forming a substrate on which a low melting point metal bump is to be formed. Next, as shown in FIG. 4C, a solder ball 46 of Pb—Sn alloy having a diameter of 80 μm is adhesive bonded to the Cu metal layer 45. At the time of adhesive bonding the solder ball, the surface of the metal layer 45 is first coated with a flux (not shown) by screen printing. In cases where, for example, the solder ball placed on the electrode is subsequently to be reflowed in a reducing atmosphere, coating the metal layer 45 with the flux may be omitted. The solder ball 46 is then adhesive bonded to the flux. A preferred method for adhesive bonding the solder ball to the electrode will be explained later.

The semiconductor device of the present invention thus prepared can be flip chip bonded to a substrate by making the solder ball bumps face the respective corresponding electrode terminals of the substrate, positioning the bumps, contacting the bumps with the respective electrode terminals thereof, and reflowing the bumps.

Figure 4D:
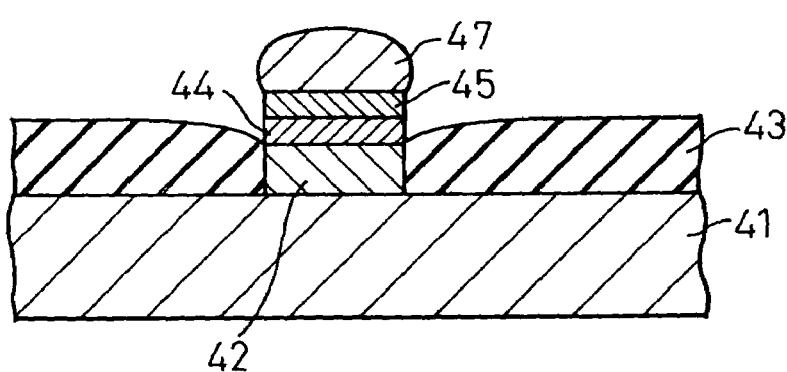

The semiconductor device of the present invention provided with the bumps of solder balls 46 as shown in FIG. 4C may also be flip chip bonded to the substrate after forming semispherical bumps 47 by reflowing the solder balls once as shown in FIG. 4D.

Figure 5:
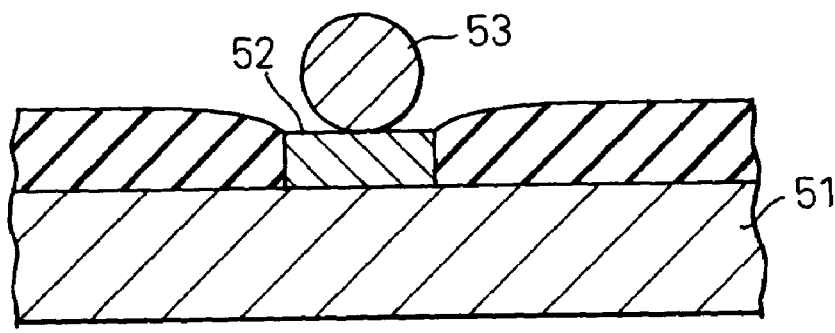
FIG. 5 is a view illustrating a bump of a solder ball directly formed on a chip electrode of a single material.

Since an Al alloy is used as an electrode material in the above example, the Ni layer and the Cu layer are laminated to the Al alloy layer so as to firmly bond the semiconductor device to the substrate by the solder bump. However, when the electrode material is neither Al nor Al alloy, for example, when the electrode material is Cu or a Cu alloy, or Au or a Au alloy, the substrate (one or more metal (or alloy) layers on the electrode material layer) for forming low melting point metal bumps is not required to be formed. Accordingly, as shown in FIG. 5, a bump of a solder ball 53 can be directly formed on an electrode 52 of a semiconductor chip 51. The solder ball bump may also be reflowed once to be formed into a semispherical bump, which is thereafter used for flip chip bonding.

Another example will now be described, in which solder ball bumps having a diameter of 150 μm are formed on an electrode having a diameter of 50 μm. In this case, Cr, Cu, and Au layers are successively superposed by sputtering process on an electrode of Al—Cu alloy having a diameter of 50 μm and a thickness of 1.0 μm, the superposed Cr, Cu, and Au layers having a thickness of 80 nm, 80 nm, and 30 nm, respectively, and a diameter which is the same as or somewhat larger than the diameter of the electrode. The surface of the Au layer is then coated with a flux, on which a solder ball of Pb—Sn alloy having a diameter of 150 μm is adhesive bonded. Shear test carried out for semispherical bumps formed by reflowing the solder balls revealed that all fractures occurred in the solder balls, and no fracture was observed at the bonded portions between the bumps and electrodes.

Next, a preferred method for adhesive bonding the solder balls to the electrodes will be explained. At present, an explanation will be made of adhesive bonding the solder balls to not electrodes each having a multilayered structure but electrodes each composed of a single material as explained in FIG. 5.

Figure 6A:
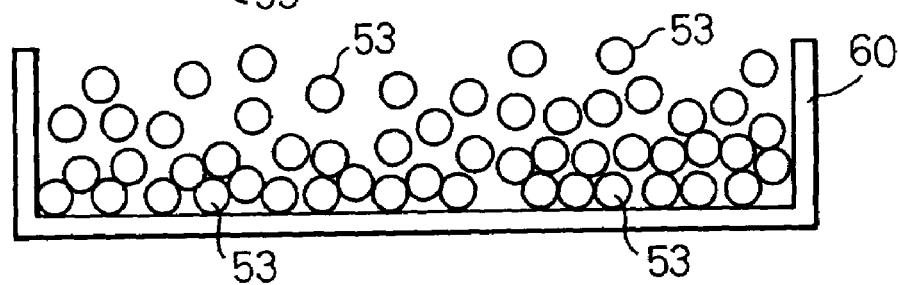
FIGS. 6A and 6B are views illustrating a preferred method for adhesive bonding low melting point metal balls to the respective electrodes.

As shown in FIG. 6A, a vibration at a small amplitude is applied to a vessel 60 containing the solder balls 53 to cause the solder balls 53 to jump up. The solder balls 53 are then arranged and held on an arrangement base plate 63 by attracting the jumping up solder balls 53 to attraction openings 61 (attracting mechanism for attracting the solder balls being not shown) provided in the arrangement base plate 63 in positions corresponding to positions of the electrodes of the semiconductor chip to which the solder balls 53 are to be adhesive bonded. During attracting and arranging the solder balls, excess solder balls 53' adhere to portions of the arrangement base plate 63 other than the attraction openings 61, or other excess solder balls 53" adhere to the solder balls 53 attracted to the attraction openings 61, as shown in FIG. 6A. The excess solder balls 53', 53" are, therefore, removed. To achieve the removal, arbitrary procedures may be utilized. For example, excess solder balls 53', 53" can be preferably removed by applying an ultrasonic vibration to the arrangement base plate 63 in the horizontal direction. Although only two attraction openings 61 are shown in the attraction base plate 63 in FIG. 6A for the sake of simplicity, it should be noted that the actual arrangement base plate has the attraction openings the number of which is the same as that of the solder balls to be adhesive bonded to the electrodes of the semiconductor chip.

Figure 6B:
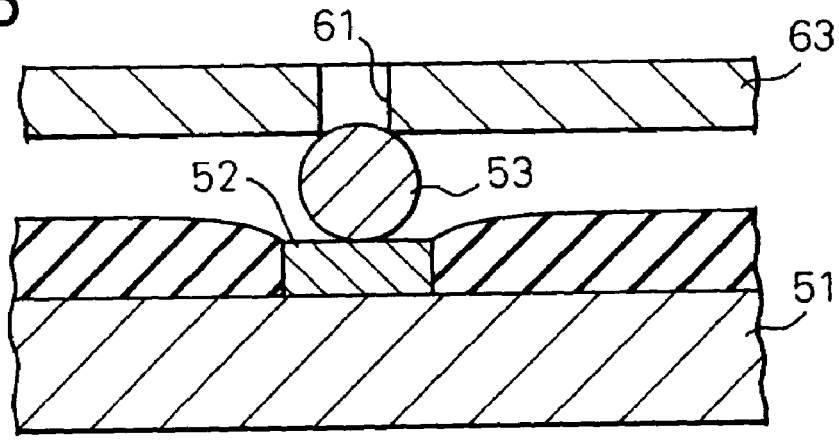

Next, as shown in FIG. 6B, the arrangement base plate 63 holding the solder balls 53 in predetermined positions is moved above the semiconductor chip 51 so that the solder balls 53 are properly positioned with respect to the respective electrodes 52 of the semiconductor chip 51.

The arrangement base plate 63 is then moved downward so that the solder balls 53 are contacted with the respective electrodes 52. After the contact, attracting the solder balls 53 to the arrangement base plate 63 is stopped (by stopping the attraction mechanism), and the arrangement base plate 63 is moved upward.

When the surface of the electrodes 52 is coated with a flux (not shown in the figure), the solder balls 53 are adhesive bonded to the electrodes due to the adhesion thereof. When the surface of the electrodes 52 is not coated with a flux, semispherical bumps adhesive bonded to the respective electrodes 52 can be formed by, for example, reflowing the solder balls 53 in a reducing atmosphere, as referred to above.

Since solder bumps can simultaneously be adhesive bonded to a large number of the respective electrodes of a semiconductor chip by the process as explained above, the process is very advantageous to the production of the semiconductor device of the present invention.

In general, a large number of semiconductor chips are formed on one wafer, and separated by cutting to give individual chips. The process as mentioned above may also be applied to a plurality of semiconductor chips prior to separation of them from the wafer by cutting, or it may be applied to individual semiconductor chips subsequently to separation of them therefrom. It is evident from what has been explained above that the semiconductor chip in the present invention includes not only a separated individual semiconductor chip but also a plurality of semiconductor chips in a state of being produced on one wafer.

It is evident from what has been explained above that the semiconductor device of the present invention is provided with low melting point metal ball bumps directly adhesive bonded to the respective electrodes formed on a semiconductor chip. The bumps can be made of high quality by making the size of the metal balls uniform. The metal balls are not formed on the electrodes of the semiconductor chip by a procedure such as plating or vapor deposition in conventional processes, but can be adhesive bonded to the electrodes. Accordingly, the semiconductor device of the present invention can be produced without a mask, and without fear of environmental pollution.

Furthermore, the amount of bumps can be easily and highly accurately controlled by adjusting the size of the low melting point metal balls, to enhance reliability of bumps.

INDUSTRIAL APPLICABILITY

The present invention can be advantageously applied to flip chip bonding which makes possible high density mounting of a semiconductor device on a substrate.

The invention claimed is:

1. A process for producing a semiconductor device to be mounted on a substrate by flip chip bonding comprising electrodes formed on a semiconductor chip, and spherically formed metal balls having a diameter of not greater than 150 micrometers, and adhesive bonded to the electrodes (8), wherein each electrode (8) includes a layer of an electrode material (5) and at least one layer (6, 7) laminated to the layer of the electrode material (5) to avoid deterioration of bonding such that the at least one layer (6, 7) has peripheral dimensions substantially the same as or larger than those of the electrode material (5); said process comprising:

adhesive bonding the metal balls to the electrodes with a flux without reflowing the metal balls, whereby the metal balls are only bonded to the electrodes with flux without reflowing, and are physically attached to tops of the electrodes.

2. A process for producing a semiconductor device to be mounted on a substrate by flip chip bonding comprising electrodes formed on a semiconductor chip, and spherically formed metal balls having a diameter of not greater than 150 micrometers, and adhesive bonded to the electrodes (8), wherein each electrode (8) includes a layer of an electrode material (5) and at least one layer (6, 7) laminated to the layer of the electrode material (5) to avoid deterioration of bonding such that at least one of the at least one layer (6, 7) has a thickness which is smaller than that of the electrode material (5) and the at least one layer (6, 7) has peripheral dimensions substantially the same as or larger than those of the electrode material (5); said process comprising:

adhesive bonding the metal balls to the electrodes with a flux without reflowing the metal balls, whereby the metal balls are only bonded to the electrodes with flux without reflowing, and are physically attached to tons of the electrodes.

3. The process according to claim 1 or 2 comprising: applying the flux to the electrodes.

4. The process according to claim 1 or 2, wherein the metal balls are adhesive bonded to the electrodes by a process comprising the steps of:

applying a vibration at a small amplitude to a vessel containing the metal balls to cause the metal balls to jump up;

arranging and holding the metal balls on an arrangement base plate by attracting the jumping up metal balls to attraction openings provided in the arrangement base plate in positions corresponding to the electrodes of the semiconductor chip to which the metal balls are to be adhesive bonded;

removing excess metal balls adhering either to the arrangement base plate or to the metal balls attracted to the attraction openings; and simultaneously contacting the metal balls held and arranged on the arrangement base plate with the electrodes of the semiconductor chip.

5. A semiconductor device produced by the process of claim 1 or 2, provided with metal balls adhesive bonded to the respective electrodes of the semiconductor chip.

* * * * *